(12) United States Patent
Ikushima et al.

(10) Patent No.: US 10,466,070 B2
(45) Date of Patent: Nov. 5, 2019

(54) DISCONNECTION DETECTOR

(71) Applicant: DENSO CORPORATION, Kariya, Aichi-pref. (JP)

(72) Inventors: Keisuke Ikushima, Kariya (JP); Toshiro Ishihara, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 64 days.

(21) Appl. No.: 15/754,658

(22) PCT Filed: Aug. 22, 2016

(86) PCT No.: PCT/JP2016/074307
§ 371 (c)(1),
(2) Date: Feb. 23, 2018

(87) PCT Pub. No.: WO2017/038513
PCT Pub. Date: Mar. 9, 2017

(65) Prior Publication Data
US 2018/0180447 A1 Jun. 28, 2018

(30) Foreign Application Priority Data
Aug. 28, 2015 (JP) .................................. 2015-169077

(51) Int. Cl.
*G01R 31/40* (2014.01)
*G01D 3/08* (2006.01)
(Continued)

(52) U.S. Cl.
CPC ............. *G01D 3/08* (2013.01); *G01R 31/026* (2013.01); *G01R 31/2829* (2013.01); *H02H 3/085* (2013.01); *G01R 31/382* (2019.01)

(58) Field of Classification Search
CPC .... G01R 31/025; G01R 31/396; G01R 31/40; G01R 31/382; G01R 31/026; G01D 3/08; H02H 3/085
(Continued)

(56) References Cited

U.S. PATENT DOCUMENTS 3,863,109 A * 1/1975 Emanuel ............... H01F 27/402
361/35
6,975,978 B1 * 12/2005 Ishida ............... G01R 31/31834
324/762.03
(Continued)

FOREIGN PATENT DOCUMENTS

JP 2000131369 A 5/2000

*Primary Examiner* — Jermele M Hollington
*Assistant Examiner* — Taqi R Nasir
(74) *Attorney, Agent, or Firm* — Harness, Dickey & Pierce, P.L.C.

(57) ABSTRACT

A disconnection detector includes: a plurality of energizing circuits that supply a constant current from a direct current power supply to a plurality of loads through resistor elements, respectively, the resistor elements each having a predetermined resistance value; a plurality of voltage detectors that are respectively arranged at the plurality of energizing circuits, and that are respectively configured to detect a voltage of a corresponding one of the resistor elements at a load side; and a control circuit that determines, for each of the plurality of energizing circuits, a disconnected state of an energizing path to a corresponding one of the plurality of loads, based on voltages respectively detected by the plurality of voltage detectors.

6 Claims, 13 Drawing Sheets

(51) Int. Cl.
  *G01R 31/02* (2006.01)
  *G01R 31/28* (2006.01)
  *H02H 3/08* (2006.01)
  *G01R 31/382* (2019.01)

(58) Field of Classification Search
  USPC .......... 324/509, 693, 426, 434, 418, 761.01,
    324/764.01, 130, 107, 78, 43, 4, 126,
    324/510, 760.02, 165, 762.06, 384, 388,
    324/537–555; 257/48, 316, E29.3,
    257/E23.002; 320/165, 116, 120, 122,
    320/134, 136, 117
  See application file for complete search history.

(56) References Cited

U.S. PATENT DOCUMENTS

| | | | | |
|---|---|---|---|---|
| 7,768,288 | B2 * | 8/2010 | Kao | G01R 31/31718 |
| | | | | 324/762.06 |
| 7,852,047 | B2 * | 12/2010 | Osamura | H02J 7/0026 |
| | | | | 320/116 |
| 8,629,687 | B2 * | 1/2014 | Ishikawa | G01R 31/026 |
| | | | | 320/134 |
| 2007/0145981 | A1 * | 6/2007 | Tomita | G01R 31/3008 |
| | | | | 324/509 |
| 2010/0327878 | A1 * | 12/2010 | Ishikawa | G01R 31/026 |
| | | | | 324/537 |
| 2012/0001640 | A1 * | 1/2012 | Hashimoto | B60L 3/0069 |
| | | | | 324/434 |
| 2012/0025836 | A1 * | 2/2012 | Furukawa | H01M 10/441 |
| | | | | 324/434 |
| 2013/0265058 | A1 * | 10/2013 | Danner | G01R 31/3835 |
| | | | | 324/433 |

* cited by examiner

DISCONNECTION DETECTOR

CROSS REFERENCE TO RELATED APPLICATIONS

This application is a U.S. National Phase Application under 35 U.S.C. 371 of International Application No. PCT/JP2016/074307 filed on Aug. 22, 2016 and published in Japanese as WO 2017/038513 A1 on Mar. 9, 2017. This application is based on and claims the benefit of priority from Japanese Patent Application No. 2015-169077 filed on Aug. 28, 2015. The entire disclosures of all of the above applications are incorporated herein by reference.

TECHNICAL FIELD

The present disclosure relates to a disconnection detector.

BACKGROUND ART

In a circuit that drives a load by delivering constant current, a current value can be calculated by reading a voltage drop of a resistor through which the energizing path passes. Based on the fact that constant current flows when the circuit is functioning normally, the circuit can be determined to be in a normal state. Likewise, a possibility of a disconnection failure can be detected when the current value is short of a constant current level.

In the circuit in which constant current is delivered, the resistance value of the load is adjusted by means of a current-limiting resistor connected in series to the load, so that constant current is delivered by a power supply voltage. Accordingly, when the power supply voltage is low, the resistance value of the current-limiting resistor is reduced, which in turn reduces the amount of voltage drop at both ends of the resistor when the load is energized. As a result, the change in the level of detected voltage between when the circuit is in an on state and when the circuit is in an off state will be small. A high precision amplifier needs to be added in order to detect such a change accurately, which will lead to higher cost.

Even in a configuration provided with a high precision amplifier, there is a possibility that the detected voltage is obscured and causes erroneous determination, when the power supply voltage that supplies power to the load fluctuates and the fluctuations in the power supply voltage are large.

PRIOR ART LITERATURES

Patent Literature

Patent Literature 1: JP 2000-131369 A

SUMMARY OF INVENTION

It is an object of the present disclosure to provide a disconnection detector for a circuit that drives each of a plurality of loads by delivering constant current, the disconnection detector being capable of performing a process of determining a disconnection accurately without using an expensive amplifier even when power supply voltage is low, and also even when power supply voltage fluctuates.

A disconnection detector according to an aspect of the present disclosure includes: a plurality of energizing circuits that supply a constant current from a direct current power supply to a plurality of loads through resistor elements, respectively, the resistor elements each having a predetermined resistance value; a plurality of voltage detectors that are respectively arranged at the plurality of energizing circuits, and that are respectively configured to detect a voltage of a corresponding one of the resistor elements at a load side; and a control circuit that determines, for each of the plurality of energizing circuits, a disconnected state of an energizing path to a corresponding one of the plurality of loads, based on voltages respectively detected by the plurality of voltage detectors. The control circuit inputs and stores initial values of detected voltages that are detected by the plurality of voltage detectors when the plurality of loads are not energized by the plurality of energizing circuits. When one of the plurality of loads is energized by one of the plurality of energizing circuits, the control circuit calculates a voltage across terminals of one of the resistor elements arranged at the one of the plurality of energizing circuits, which energizes one of the plurality of loads, based on a first detected voltage detected by one of the plurality of voltage detectors arranged at the one of the plurality of energizing circuit, which carries out energizing the one of the plurality of loads, a second detected voltage detected by another one of the plurality of voltage detectors arranged at another one of the plurality of energizing circuits, which does not carry out energizing another one of the plurality of loads, and the initial values of detected voltages which are stored, and the control circuits determines that the energizing path to the one of plurality of loads, which is energized, is in a disconnected state when the voltage across terminals of the one of the resistor elements is equal to or lower than a threshold voltage.

By adopting the disconnection detector described above, a correct voltage can be detected in the following manner by a control circuit. The control circuit inputs and stores initial values of detected voltages that are detected by the voltage detectors when the loads are not energized by the plurality of energizing circuits. The control circuit can then calculate the voltage across terminals of the resistor element provided in the energizing circuit of the energized load, from the first detected voltage detected by the voltage detector provided in the energizing circuit of one of the loads when the load is energized, the second detected voltage detected by the voltage detector provided in the energizing circuit of the unenergized load, and the initial values of detected voltages.

Since the terminal voltage on the power supply side of the resistor element can be determined from the initial values of detected voltages by using the second detected voltage detected at the same timing as the first detected voltage, the voltage across terminals of the resistor element can be calculated correctly even when the power supply voltage fluctuates. As a result, a disconnected state of the energizing path for the energized load can be determined correctly when the voltage across terminals determined by the calculation is equal to or lower than the threshold voltage.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

A first embodiment of the present disclosure will be hereinafter described with reference to FIG. 1 to FIG. 4.

Figure 1:
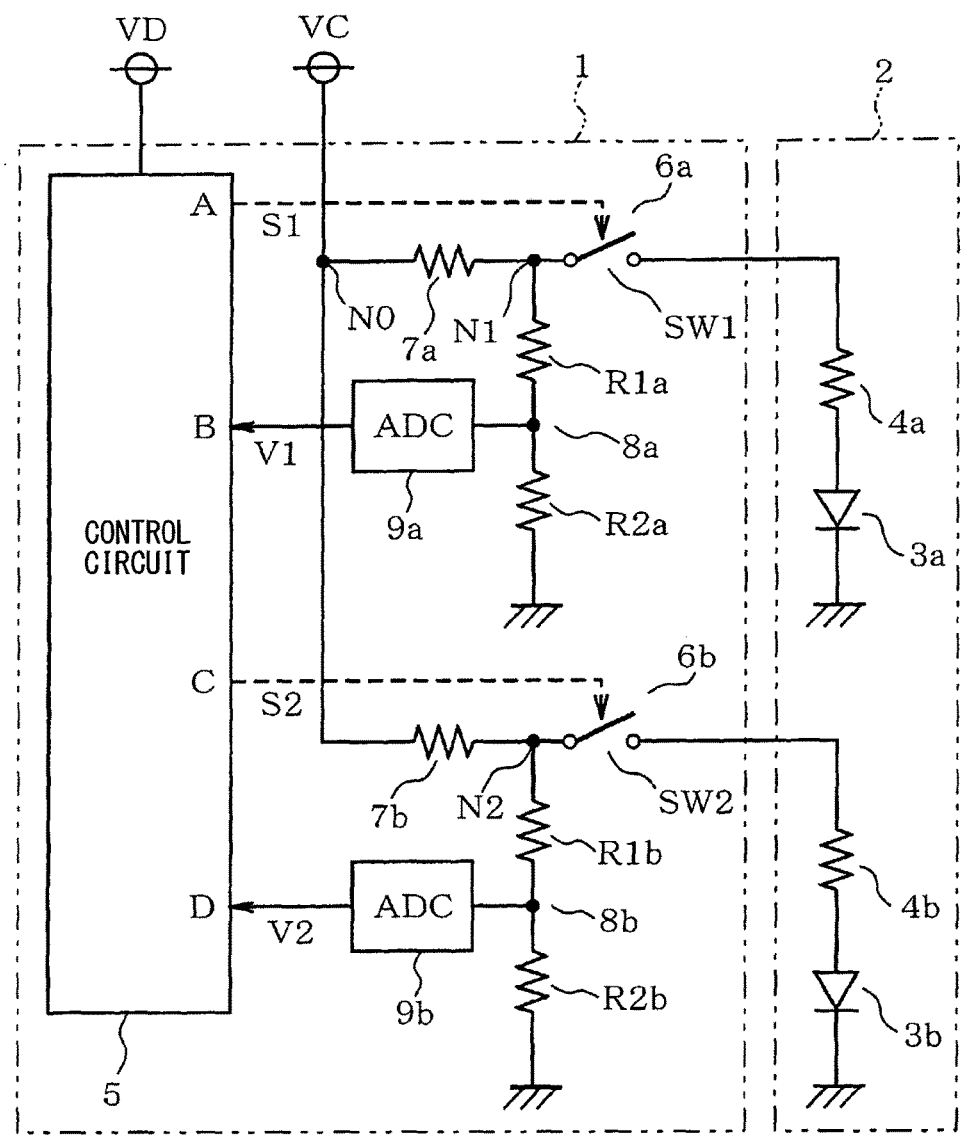
FIG. 1 is an electrical configuration diagram illustrating a first embodiment.

In FIG. 1, the disconnection detector 1 controls powering on and off of an LED circuit 2, and detects a disconnection in a power supply line of the LED circuit 2. The LED circuit 2 is provided with two LEDs 3a and 3b, for example, as a plurality of constant current-driven loads. These two LEDs 3a and 3b emit light of different colors such as red and green, and are provided for indication purposes such as indicators.

The LEDs 3a and 3b are each connected to the disconnection detector 1 with resistors 4a and 4b respectively connected in series for adjusting the LED brightness. The disconnection detector 1 is configured by a control circuit 5 as the main body, and includes a circuit that powers the LEDs 3a and 3b of the LED circuit 2. The LED circuit 2 is powered by a direct current (DC) power supply VC via the disconnection detector 1. The DC power supply VC is generated by lowering the voltage of a DC power supply where voltage fluctuates, such as an in-vehicle battery, for example. The DC power supply VC also powers other loads than the LEDs 3a and 3b, and the power supply voltage VC fluctuates resulting from an internal resistance depending on the state of power supply to the loads. The control circuit 5 is powered by a DC power supply VD of a predetermined voltage, which is generated by lowering the voltage separately from the power supply mentioned above such as a battery. The control circuit 5 includes a microcomputer and a memory or an interface circuit. A control program to be described later is stored in the memory for the disconnection determination process to be performed.

Constant current is delivered to the LEDs 3a and 3b respectively by energizing circuits 6a and 6b. The energizing circuit 6a of the LED 3a is configured to connect the DC power supply VC with the resistor 4a and LED 3a via a node N0, a resistor 7a as a resistor element for current detection, a node N1, and a switch SW1. Control signals S1 are given to the switch SW1 from an output terminal A of the control circuit 5.

The node N1 is connected to ground via a voltage divider circuit 8a for voltage detection. The voltage divider circuit 8a is a series circuit of resistors R1a and R2a. The common connection point of the resistors R1a and R2a is connected to an input terminal B of the control circuit 5 via an AD converter 9a. The AD converter 9a inputs a voltage detection signal V1 converted to a digital signal to the input terminal B of the control circuit 5. The voltage divider circuit 8a and AD converter 9a constitute a voltage detector.

The energizing circuit 6b of the LED 3b is configured to connect the DC power supply VC with the resistor 4b and LED 3b via a node N0, a resistor 7b as a resistor element for current detection, a node N2, and a switch SW2. Control signals S2 are given to the switch SW2 from an output terminal C of the control circuit 5.

The node N2 is connected to ground via a voltage divider circuit 8b for voltage detection. The voltage divider circuit 8b is a series circuit of resistors R1b and R2b. The common connection point of the resistors R1b and R2b is connected to an input terminal D of the control circuit 5 via an AD converter 9b. The AD converter 9b inputs a voltage detection signal V2 converted to a digital signal to the input terminal D of the control circuit 5. The voltage divider circuit 8b and AD converter 9b constitute a voltage detector.

Figure 3:
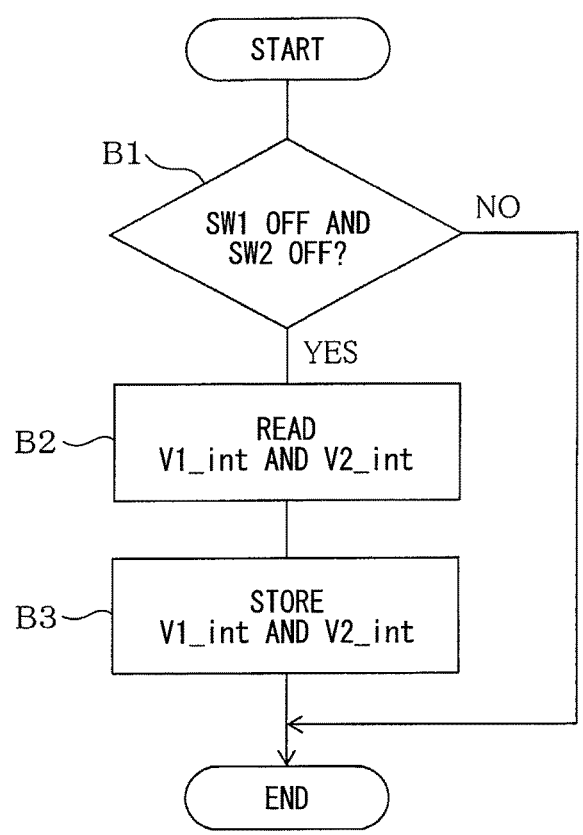
FIG. 3 is a flowchart of a power supply voltage reading process.
Figure 4:
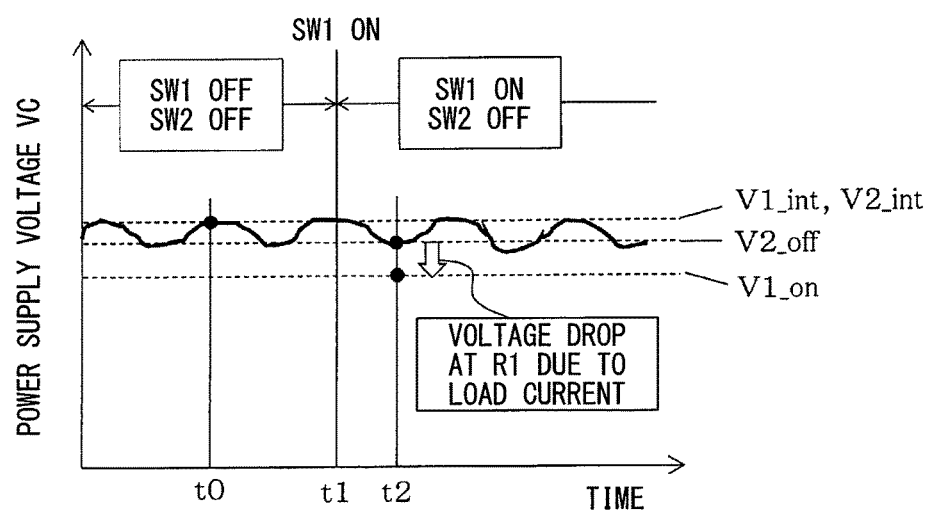
FIG. 4 is a diagram illustrating a power supply waveform for explaining the effects.

Next, the effects of the configuration described above will be described with reference also to FIG. 2 to FIG. 4.

The control circuit 5 lightens the LEDs 3a and 3b as follows. When lighting the LED 3a, the control circuit 5 outputs an illumination signal S1 from the output terminal A to turn on the switch SW1 of the energizing circuit 6a. Thus, the power supply voltage VC is applied to the LED circuit 2 via the resistor 7a and switch SW1. The LED 3a is energized via the resistor 4a in the LED circuit 2 so that the LED 3a is turned on.

When lighting the LED 3b, the control circuit 5 outputs an illumination signal S2 from the output terminal C to turn on the switch SW2 of the energizing circuit 6b. Thus, the power supply voltage VC is applied to the LED circuit 2 via the resistor 7b and switch SW2. The LED 3b is energized via the resistor 4b in the LED circuit 2 so that LED 3b is turned on.

When the powering on and off of the LEDs 3a and 3b is controlled by the control circuit 5 as described above, voltage detection signals V1 and V2 are input in a suitable sampling cycle from the AD converters 9a and 9b irrespective of the on/off state of the switches SW1 and SW2.

In the energizing circuit 6a, the voltage at the node N1, which is the connection point between the resistor 7a and the switch SW1, is detected by the voltage divider circuit 8a. A voltage signal, after divided by the resistors R1a and R2a of the voltage divider circuit 8a and converted into a digital signal by the AD converter 9a, is input to the input terminal B of the control circuit 5 as voltage detection signal V1.

In the energizing circuit 6b, the voltage at the node N2, which is the connection point between the resistor 7b and the switch SW2, is detected by the voltage divider circuit 8b. A voltage signal, after divided by the resistors R1b and R2b of the voltage divider circuit 8b and converted into a digital signal by the AD converter 9b, is input to the input terminal D of the control circuit 5 as voltage detection signal V2.

The control circuit 5 determines whether the electrical connection state of the energizing path to the LED circuit 2 is maintained normal based on the voltage detection signals V1 and V2 input to the input terminals B and D when controlling the powering on and off of the LEDs 3a and 3b as described above. Namely, the control circuit 5 repeatedly performs a disconnection determination process shown in the flowchart of FIG. 2 at a suitable timing in accordance with the program stored in the internal memory. The program is repeatedly executed with a frequency or time interval that allows the control circuit to sufficiently follow the fluctuations of the power supply voltage.

Figure 2:
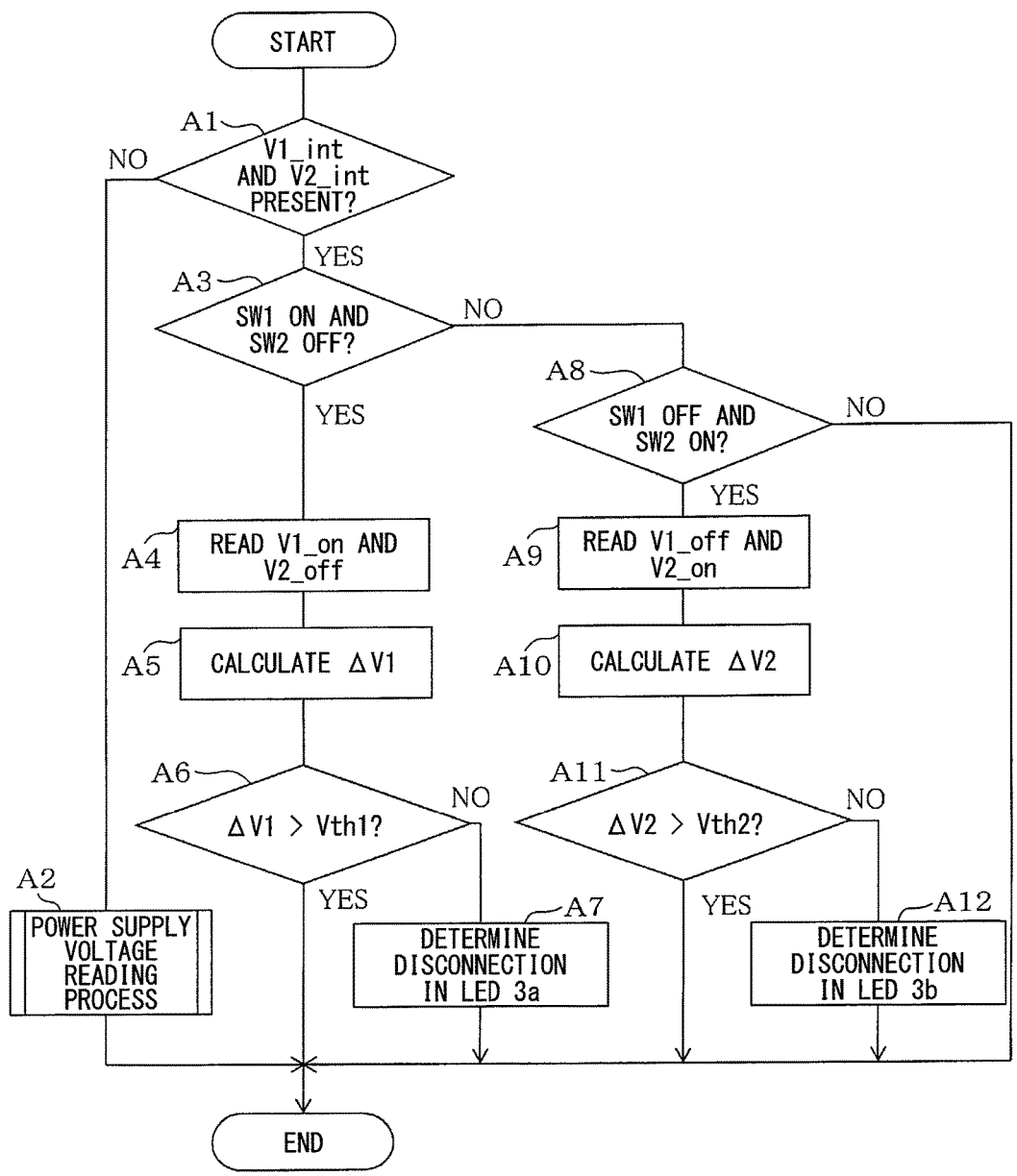
FIG. 2 is a flowchart of a disconnection determination process.

When the disconnection determination process shown in FIG. 2 is started, the control circuit 5 first determines at step A1 whether initial values V1_int and V2_int of the voltage detection signals V1 and V2 have been obtained. This refers to the voltage at the nodes N1 and N2 when the switches SW1 and SW2 are both in the OFF state so that neither of the LEDs 3a and 3b is turned on. In this state, since the LED circuit 2 is not energized, there is no voltage drop caused by the resistors 7a and 7b, and so the voltage at the nodes N1 and N2 is substantially equal to the power supply voltage VC.

Acquisition of the initial values V1_int and V2_int of the voltage detection signals V1 and V2 will be described. When the initial values V1_int and V2_int of the voltage detection signals V1 and V2 have not been obtained yet, the control circuit 5 determines that the answer is NO at step A1. The control circuit 5 then executes the power supply voltage reading process shown in FIG. 3 as step A2. When the power supply voltage reading process shown in FIG. 3 is started, the control circuit 5 first determines at step B1 whether the switches SW1 and SW2 are both in the OFF state.

When neither of the LEDs 3a and 3b is turned on, the determination at step 131 is YES, and the control circuit 5 takes the voltage detection signals V1 and V2 as the initial values V1_int and V2_int. After that, the control circuit 5 stores, in the internal memory, the initial values V1_int and V2_int that have been read at step B3, and ends the program. When the control circuit 5 has already obtained the initial values V1_int and V2_int and stored in the internal memory at step A1 of the disconnection determination process, the process proceeds to step A3.

As described above, when the initial values V1_int and V2_int of the voltage detection signals V1 and V2 have been obtained, the control circuit 5 determines that the answer is YES at step A1 when executing the disconnection determination process again. Next, the control circuit 5 determines whether one of the LEDs 3a and 3b of the LED circuit 2 is turned on while the other is turned off. The control circuit 5 first determines at step A3 whether the switch SW1 is on while the switch SW2 is off. If the determination is YES, the control circuit 5 reads the voltage detection signals V1 and V2 at this time in the following step A4.

In this case, since the switch SW1 is ON, the LED 3a is illuminating, while since the switch SW2 is OFF, the LED 3b is not illuminating. The control circuit 5 reads the voltage detection signal V1 as V1_on and the voltage detection signal V2 as V2_off in the next step A4. Subsequently at step A5, the control circuit 5 determines the voltage across the terminals ΔV1 of the resistor 7a by calculation in accordance with the current through the illuminated LED 3a based on the read voltage detection signals. The control circuit 5 makes the calculation of the voltage across the terminals ΔV1 by the following method using the voltage detection signals V1_on and V2_off, and initial values V1_int and V2_int.

Since the current flowing through the LED 3a is a constant current, the voltage across the terminals generated when the constant current flows through the resistor 7a is constant, too. Therefore, if there is no disconnection in the energizing path for the LED circuit 2, the voltage across the terminals ΔV1 determined by calculation should be equal to the constant voltage. Even though the current value is somewhat lower due to deterioration of the LED 3a, current keeps flowing unless there is a disconnection. Therefore, it can be determined that there is a disconnection if the voltage across the terminals ΔV1 at least exceeds a threshold voltage Vth.

The control circuit 5 therefore determines at the next step A6 whether the voltage across the terminals ΔV1 obtained by calculation is larger than the threshold voltage Vth, and if YES, determines that it is normal, and ends the program. When the determination by the control circuit 5 at step A6 is NO, it determines at the following step A7 that there is a disconnection in the energizing path for the LED 3a because the voltage across the terminals ΔV1 is low, and ends the program.

To determine whether there is a disconnection in the energizing path for the LED 3b, the control circuit 5 determines in the following manner based on the states of the switches SW1 and SW2. In executing the program for the disconnection determination process, the control circuit 5 determines the state where the switch SW2 is on while the switch SW1 is off. In this case, the determination by the control circuit 5 is YES at step A1, NO at step A3, and YES at step A8. Next, the control circuit 5 reads the voltage detection signals V1 and V2 at this time at step A9.

In this case, the control circuit 5 reads the voltage detection signal V1 as V1_off and the voltage detection signal V2 as V2_on in step A9. Subsequently, at step A10, the control circuit 5 determines the voltage across the terminals ΔV2 of the resistor 7b by calculation in accordance with the current through the illuminated LED 3b based on the obtained voltage detection signals. The control circuit 5 makes the calculation of the voltage across the terminals ΔV2 by the following method using the voltage detection signals V1_off and V2_on, and initial values V1_int and V2_int.

At step A11, similarly to the voltage across the terminals ΔV1, the control circuit 5 determines whether the voltage across the terminals ΔV2 obtained by calculation is larger than the threshold voltage Vth, and if YES, determines that it is normal, and ends the program. When the determination by the control circuit 5 at step A11 is NO, the control circuit 5 determines at the following step A12 that there is a disconnection in the energizing circuit for the LED 3b because the voltage across the terminals ΔV2 is low, and ends the program.

Next, the process of calculating the voltages across the terminals ΔV1 and ΔV2 at step A5 or A10 will be described.

Theoretically, the voltage across the terminals ΔV1 can be calculated by determining the difference between the voltages at both terminals of the resistor 7a. Since the voltage at node N0 cannot be obtained directly in this configuration, the voltage V1_off at the node N1 when the switch SW1 is off, which corresponds to the voltage at node N0, can be used. However, the voltage detection signals when the switch SW1 is off and when the switch SW1 is on cannot be obtained simultaneously. In addition, since the power supply voltage VC is presumed to vary as time passes as mentioned above, a correct voltage across the terminals ΔV1 cannot be obtained even if voltage detection signals when the switch is on and when the switch is off are obtained with a time difference.

In this regard, since the configuration of the present embodiment includes energizing circuits 6a and 6b for driving a plurality of LEDs 3a and 3b and their respective voltage detection signals V1 and V2 are input, the voltage detection signal V2_off when the switch SW2 is off can be used as the voltage detection signal V1_off when the switch SW1 is off in the state where the switch SW1 is on. In such an electrical circuit, the voltage detection signal V2_off when the switch SW2 is off equals the voltage detection signal V1_off when the switch SW1 is off. Therefore, the voltage across the terminals ΔV1 can be obtained from the voltage detection signals V1_on and V2_off acquired in step A4 of the disconnection determination process.

Note, however, the voltage detection signals V1 and V2 are input to the control circuit 5 via the voltage divider circuits 8a and 8b and AD converters 9a and 9b, respectively. There may therefore be a difference in the level between the voltage detection signals V1 and V2 depending on the measurement system due to differences in voltage division ratio and resolution. To resolve this difficulty, the initial values V1_int and V2_int of voltage detection signals are measured in advance, and a conversion coefficient R is determined from the ratio of V1_int to V2_int, or a conversion coefficient D is determined from a differential value. The voltages across the terminals ΔV1 and ΔV2 can be calculated by using this conversion coefficient R or D.

With the conversion coefficient R or D, improvement in accuracy can be expected when the voltages across the terminals ΔV1 and ΔV2 are to be calculated using the conversion coefficient R that is determined by calculation of a ratio. When, in particular, the voltage division ratio is different between the voltage divider circuits 8a and 8b, or when the resolution is different between the AD converters 9a and 9b, the accuracy can be enhanced. When the voltage divider circuits 8a and 8b and the AD converters 9a and 9b have equal characteristics, the conversion coefficient D may be obtained by calculation of a difference to calculate the voltages across the terminals ΔV1 and ΔV2, which can make the software calculation process simpler.

<Calculation Using Conversion Coefficient R>

Next, the contents of specific calculation processes will be described. The power supply voltage of the DC power supply VC fluctuates as time passes in accordance with the power supply state of other loads, and varies irregularly following fluctuations as shown in FIG. 4. The control circuit 5 executes the program during the period in which the switches SW1 and SW2 are both off, and initial values V1_int and V2_int of voltage detection signals are input and stored at time t0, for example.

After that, when the switch SW1 is turned on at time t1, the control circuit 5 executes the program so that the voltage detection signals V1_on and V2_off are input at time t2. As mentioned above, theoretically, the voltage across the terminals ΔV1 can be calculated from the following Equation (1).

$$\Delta V1 = V1\_off - V1\_on \quad (1)$$

However, calculation of Equation (1) does not work because when the switch SW1 is turned on, the voltage at node N1 is detected as the voltage detection signal V1_on, and it is not possible to obtain the voltage detection signal V1_off of the node N1 when the switch SW1 is off at the same time. Therefore, by correcting a detection error in the circuit system, V2_off can be converted to V1_off as shown in the following Equation (2), using the previously detected initial values V1_int and V2_int. The conversion coefficient R (2→1) can be expressed as the following Equation (3).

$$V1\_off = R(2 \to 1) \times V2\_off \quad (2)$$

$$R(2 \to 1) = V1\_int / V2\_int \quad (3)$$

When the voltage divider circuits 8a and 8b, and AD converters 9a and 9b are in the same conditions, the conversion coefficient R (2→1) is substantially "1". If the conditions are different, a certain value can be obtained.

Thus, Equation (4) can be established by assigning Equations (2) and (3) in Equation (1). The voltage across the terminals ΔV1 can be determined by substituting values in this Equation (4).

$$\Delta V1 = (V1\_int / V2\_int \times V2\_off) - V1\_on \quad (4)$$

Similarly, ΔV2 can be obtained from the following Equation (5).

$$\Delta V2 = V2\_off - V2\_on \quad (5)$$

$$V2\_off = R(1 \to 2) \times V1\_off \quad (6)$$

$$R(1 \to 2) = V2\_int / V1\_int \quad (7)$$

$$= 1 / R(2 \to 1) \quad (8)$$

Thus, Equation (9) can be established by assigning Equations (6) and (7) in Equation (5).

$$\Delta V2 = (V2\_int / V1\_int \times V1\_off) - V2\_on \quad (9)$$

<Calculation Using Conversion Coefficient D>

Instead of the conversion coefficients R (2→1) and R (1→2) described above, conversion coefficients D (2→1) and D (1→2) representing a difference may be determined. Similarly to the foregoing, the voltage across the terminals ΔV1 can be calculated from the following Equation (1).

$$\Delta V1 = V1\_off - V1\_on \quad (1)$$

By correcting a detection error in the circuit system, V2_off is converted to V1_off as shown in the following Equation (10), using the previously detected initial values V1_int and V2_int. The conversion coefficient D (2→1) can be expressed as the following Equation (11).

$$V1\_off = D(2 \to 1) + V2\_off \quad (10)$$

$$D(2 \to 1) = V1\_int - V2\_int \quad (11)$$

When the voltage divider circuits 8a and 8b, and AD converters 9a and 9b are in the same conditions, the conversion coefficient D (2→1) is substantially "0". If the conditions are different, a certain value can be obtained.

Thus, Equation (12) can be established by assigning Equations (10) and (11) in Equation (1). The voltage across the terminals ΔV1 can be determined by substituting respective values in this Equation (12).

$$\Delta V1 = (V1\_int - V2\_int + V2\_off) - V1\_on \quad (12)$$

Similarly, ΔV2 can be obtained from the Equation (5) described above.

$$\Delta V2 = V2\_off - V2\_on \quad (5)$$

$$V2\_off = D(1 \to 2) + V1\_off \quad (13)$$

$$D(1 \to 2) = V2\_int - V1\_int \quad (14)$$

$$= -D(2 \to 1) \quad (15)$$

Thus, Equation (16) can be established by assigning Equations (13) and (14) in Equation (5).

$$\Delta V2 = (V2\_int - V1\_int + V1\_off) - V2\_on \quad (16)$$

The voltages across the terminals ΔV1 and ΔV2 of the resistors 7a and 7b when the switches SW1 and SW2 are on in the respective energizing circuits 6a and 6b can be detected correctly as described above. This enables correct determination of a disconnected state of the energizing path for the LED 3a or 3b in each energizing circuit 6a or 6b by comparison with the threshold voltage Vth.

In the present embodiment, as described above, voltage divider circuits 8a and 8b are provided respectively in the two energizing circuits 6a and 6b for detecting the voltage at nodes N1 and N2. Initial values of voltage detection signals, when no power is supplied to the LEDs 3a and 3b, are input to and stored in the control circuit 5. When one of the LEDs 3a and 3b is energized, the voltage detection signals V1 and V2 at nodes N1 and N2 are read by the control circuit 5, and the voltage across the terminals ΔV1 or ΔV2 of the energized resistor 7a or 7b can be calculated accurately from the signals, using a conversion coefficient R or D. This way, even when the power supply voltage VC is low and fluctuating, the energized state of the LED 3a or 3b can be correctly determined.

The conversion coefficient R for the calculation of the voltage across the terminals ΔV1 or ΔV2 is determined from the ratio between the initial values of voltage detection signals, which enables accurate conversion that takes into account differences in the measurement system, if any, such as a difference in the voltage division ratio between the voltage divider circuits 8a and 8b or in the resolution between the AD converters 9a and 9b.

When there is a small difference in the voltage division ratio between the voltage divider circuits 8a and 8b or in the resolution between the AD converters 9a and 9b, the conversion coefficient D for the calculation of the voltage across the terminals ΔV1 or ΔV2 can be determined by a difference between the initial values of voltage detection signals, which makes the calculation process a simple one that uses addition and subtraction.

Second Embodiment

Figure 5:
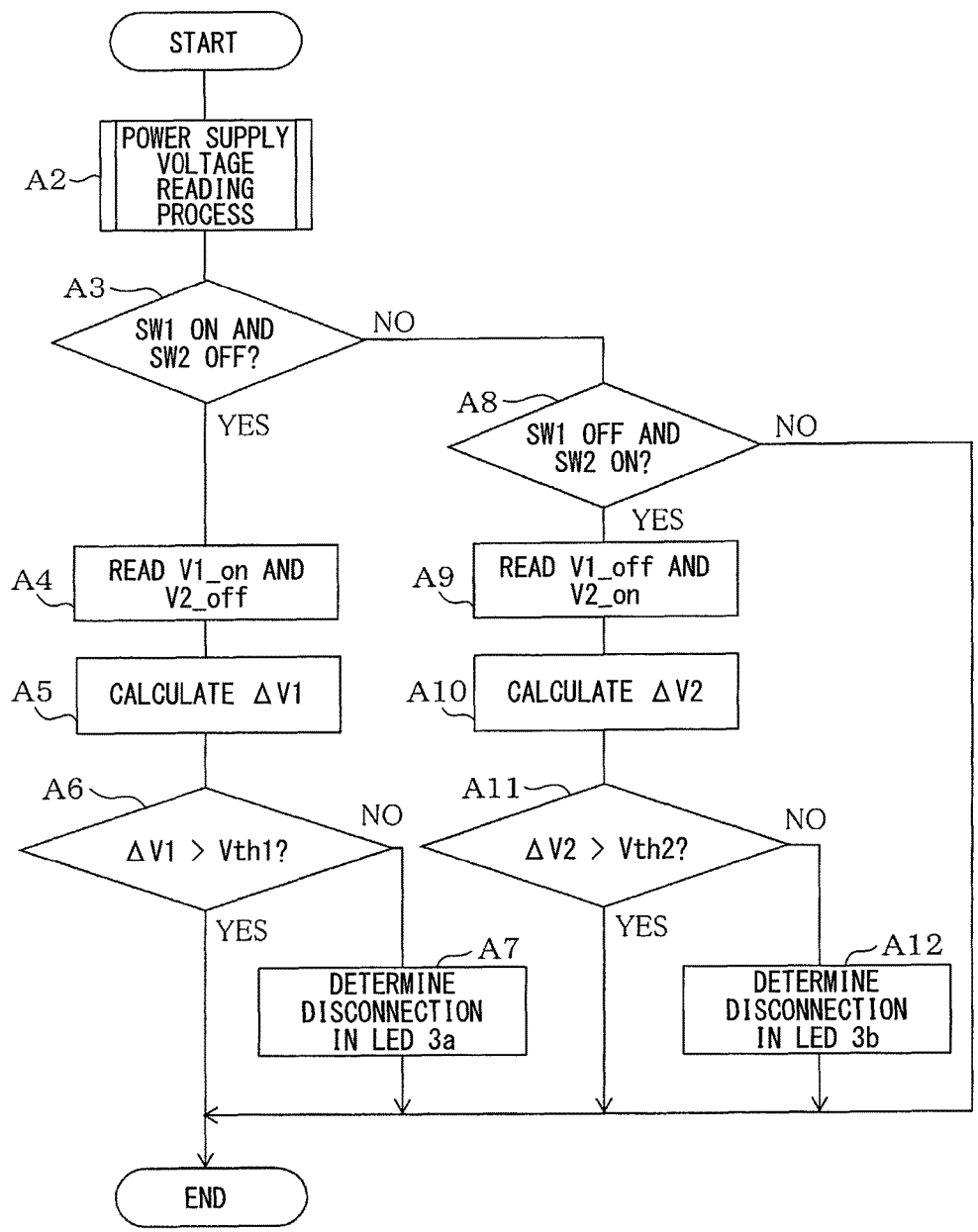
FIG. 5 is a flowchart of a disconnection determination process in a second embodiment.

FIG. 5 illustrates a second embodiment, which will be described below with respect to the parts different from the first embodiment. This embodiment takes into account the possibility of the initial values V1_int and V2_int themselves varying, when there are changes in the conditions of the measurement environment when the initial values V1_int and V2_int of the voltage detection signals are input and stored.

Namely, when the control circuit 5 continuously performs the disconnection determination process during the period in which the LED circuit 2 is driven, the conversion coefficient R or D may also change in addition to the fluctuations of the power supply voltage VC due to factors in the measurement environment of the voltage detection signals such as temperature changes. The control circuit 5 therefore increases the input frequency of the initial values V1_int and V2_int of the voltage detection signals in accordance with such changes in the environment.

The control circuit 5 executes the disconnection determination process shown in FIG. 5. The control circuit 5 first executes the voltage detection process at step A2 and performs the process of reading the initial values V1_int and V2_int of voltage detection signals. The process is the same as the previously described power supply voltage reading process shown in FIG. 3. The control circuit 5 executes the steps A3 to A12 described in the foregoing after that, so that the conversion coefficient R or D can be determined at the same timing as determining whether there is a disconnection in the energizing path for the LED 3a or LED 3b. As a result, even when the conditions of the measurement environment have changed due to temperature fluctuations, for example, the process of determining a disconnection can be performed accurately, following such changes.

According to the second embodiment, in addition to the effects of the first embodiment, the conversion coefficient R or D can be calculated accurately in accordance with changes in the conditions such as temperature changes in the measurement environment, which enables determination of a disconnection that is even more accurate.

Third Embodiment

Figure 6:
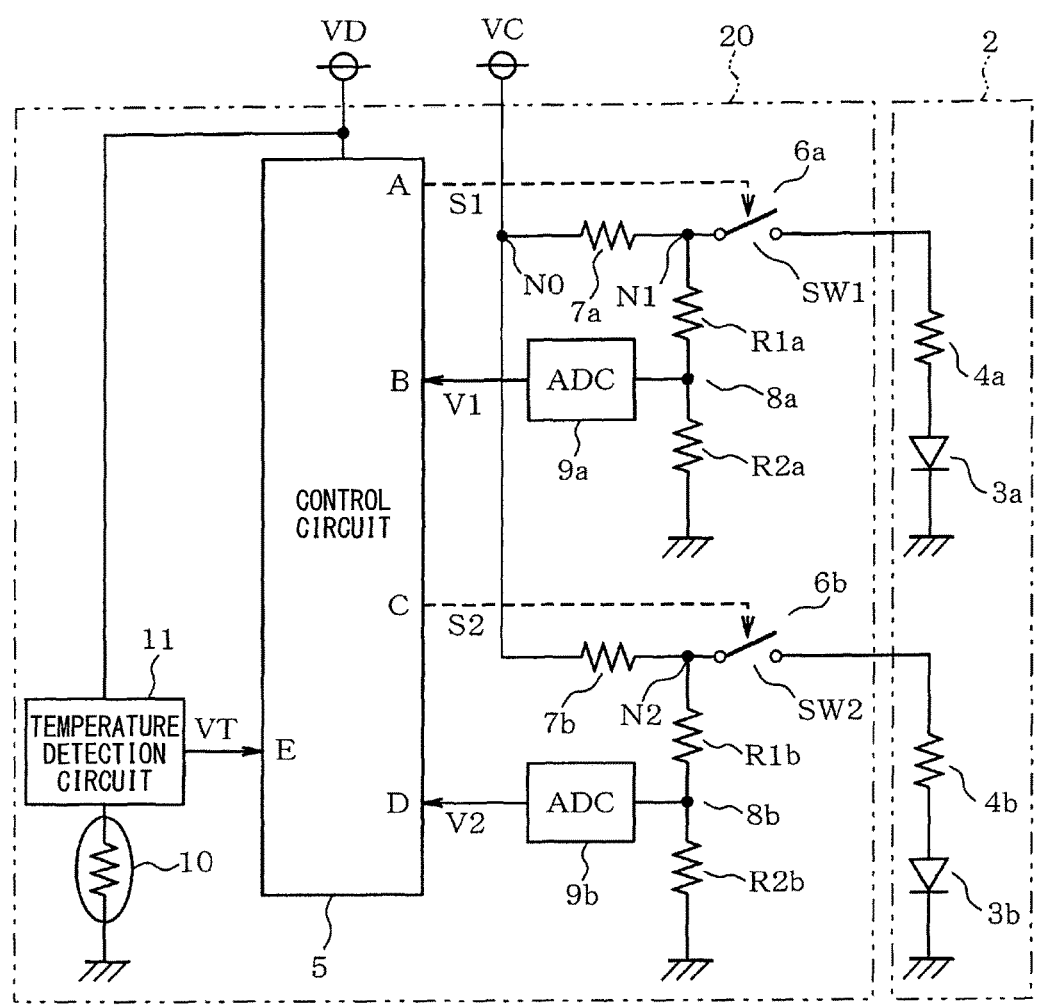
FIG. 6 is an electrical configuration diagram illustrating a third embodiment.
Figure 7:
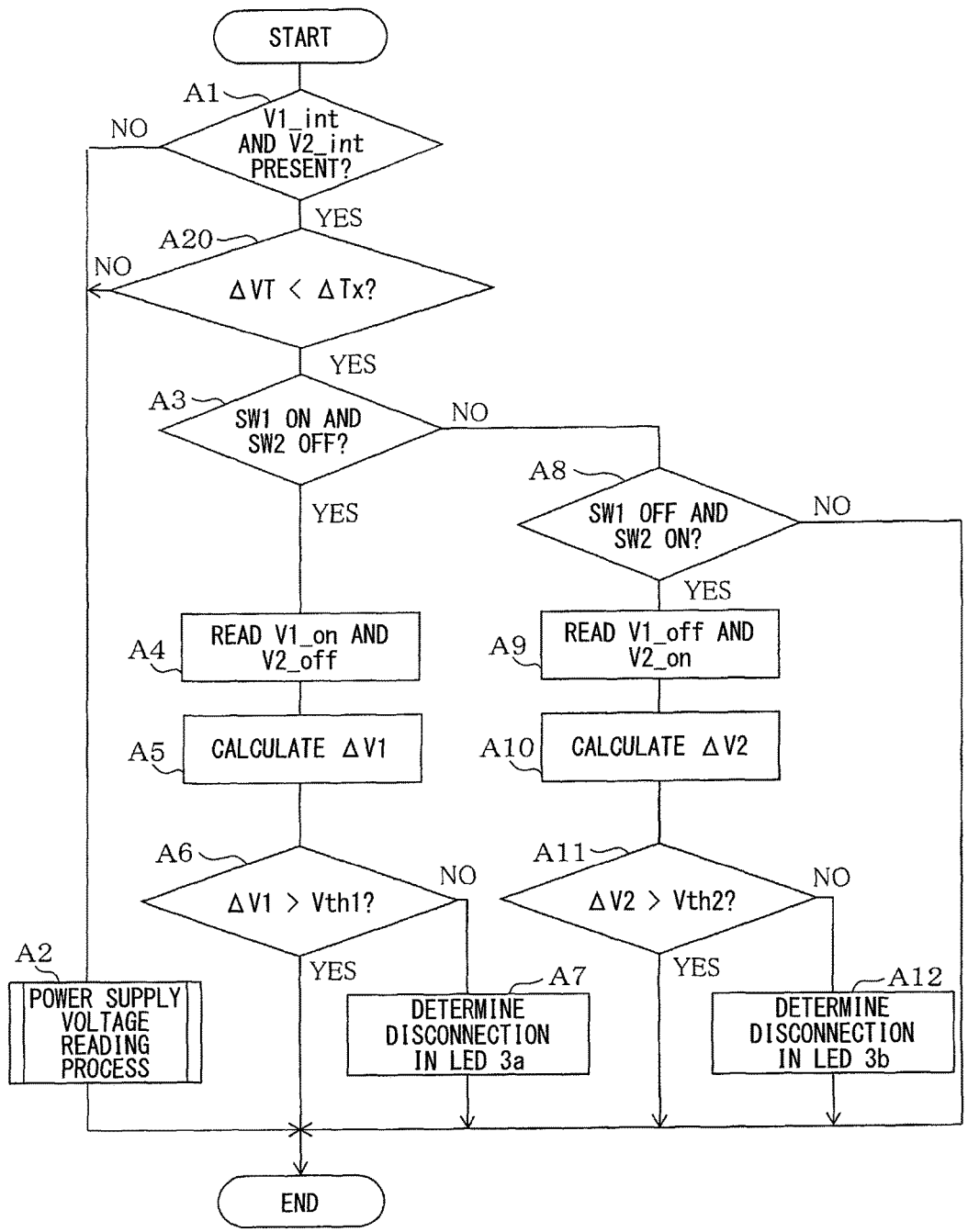
FIG. 7 is a flowchart of a disconnection determination process.

FIG. 6 and FIG. 7 illustrate a third embodiment, which will be described below with respect to the parts different from the first embodiment.

In this embodiment, as shown in FIG. 6, the disconnection detector 20 is provided with a thermistor 10 as a temperature detecting element that detects temperatures of the ambient environment. A temperature detection circuit 11 detects the voltage across terminals of the thermistor 10, converts the voltage across terminals to a digital signal, and outputs the voltage across terminals as a temperature detection signal VT to the input terminal E of the control circuit 5.

The control circuit 5 determines temperature changes in the measurement environment based on temperature detection signals VT. When executing the disconnection determination process, as shown in FIG. 7, even when the determination at first step A1 is YES, the control circuit 5 determines an amount of variation of the temperature detection signal VT at step A20 that follows step A1. The amount of variation ΔVT of the temperature detection signal VT is a difference between the previous value of temperature detection signal VT and the current value of temperature detection signal VT. The control circuit 5 determines at step A20 whether the amount of variation ΔVT is smaller than an amount of variation ΔTx that corresponds to a predetermined temperature difference.

When the determination at step A20 is YES, it means that there is small variation in the ambient temperature, so that the control circuit 5 does not execute the power supply voltage reading process for acquiring a new initial value at step A2, and the process proceeds to A3. In the process from step A3 to A12, the control circuit 5 uses the currently stored initial value.

On the other hand, when the determination at step A20 is NO, i.e., when it is determined that there has been a change in the ambient temperature, the control circuit 5 executes the power supply voltage reading process shown in FIG. 3 again at step A2, so that a new initial value is input and stored. Thereafter, when performing the disconnection determination process, the control circuit 5 likewise executes steps A3 to A12 when there is small variation in temperature, i.e., the determination at step A20 is YES. In the process of determining a disconnection, there is small variation in temperature, and since the stored initial value has been read under an equivalent temperature condition, the determination process can be performed correctly.

According to the third embodiment, the same effects as the first embodiment can be achieved, and in addition, the thermistor 10 is provided so that the initial value is obtained again when there is a large variation in temperature of the measurement environment. Thus, the voltages across terminals ΔV1 and ΔV2 can be detected accurately following temperature fluctuations, which enables the process of determining a disconnection to be performed even more accurately.

Fourth Embodiment

Figure 8:
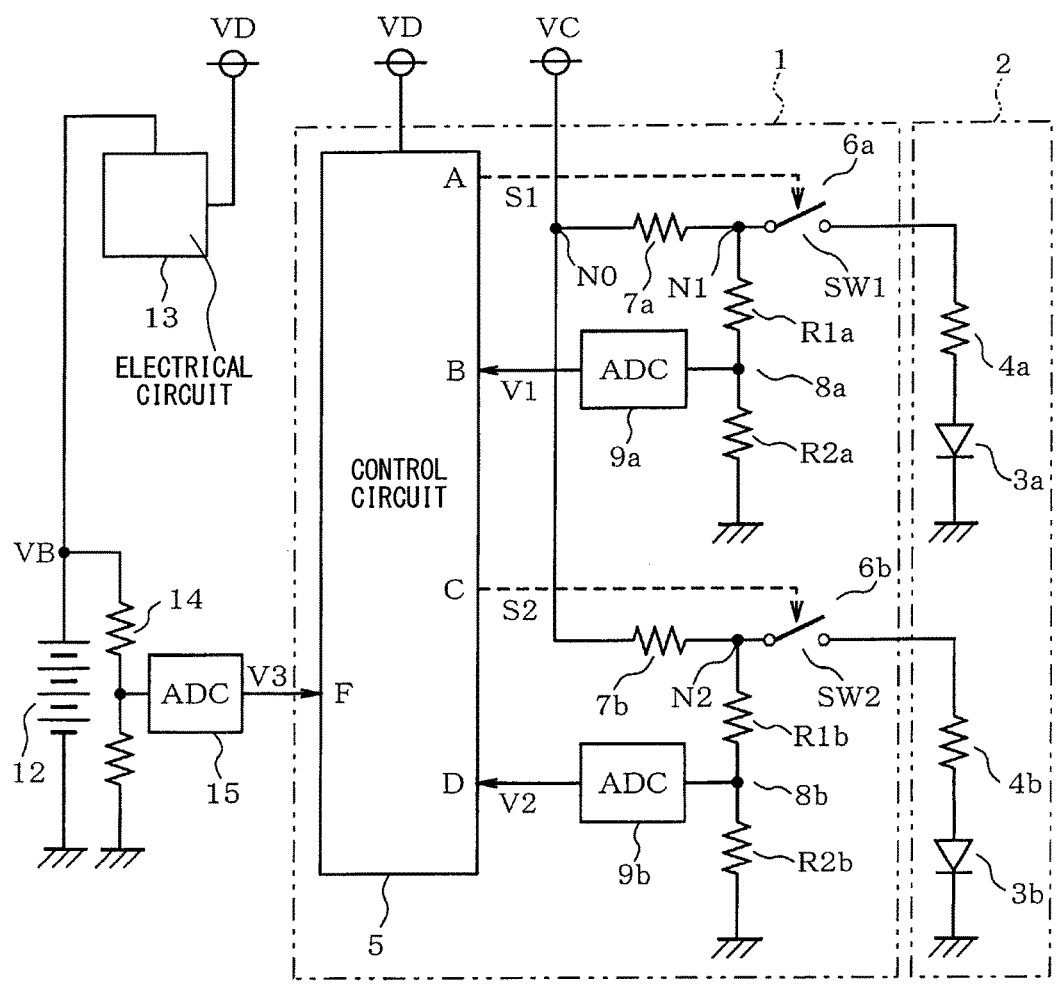
FIG. 8 is an electrical configuration diagram illustrating a fourth embodiment.

FIG. 8 to FIG. 11 illustrate a fourth embodiment, which will be described below with respect to the parts different from the first embodiment. The configuration is designed to prevent erroneous determination of a disconnection in the event of large fluctuations in power supply voltage VC. As shown in FIG. 8, the DC power supply 12 that outputs the power supply voltage VB is provided such as to supply power to the power supply circuit 13. The power supply circuit 13 generates and outputs DC voltage VD, such as the operating power supply of the control circuit 5 and reference voltage of the AD converters, by a step down circuit or the like. The voltage of the DC power supply 12 is input to the AD converter 15 via a voltage divider circuit 14, which is two series-connected resistors. The AD converter 15 converts the output of the voltage divider circuit 14 to a digital signal and inputs the output as the read value V3 of voltage VB to the input terminal F of the control circuit 5.

Figure 10:
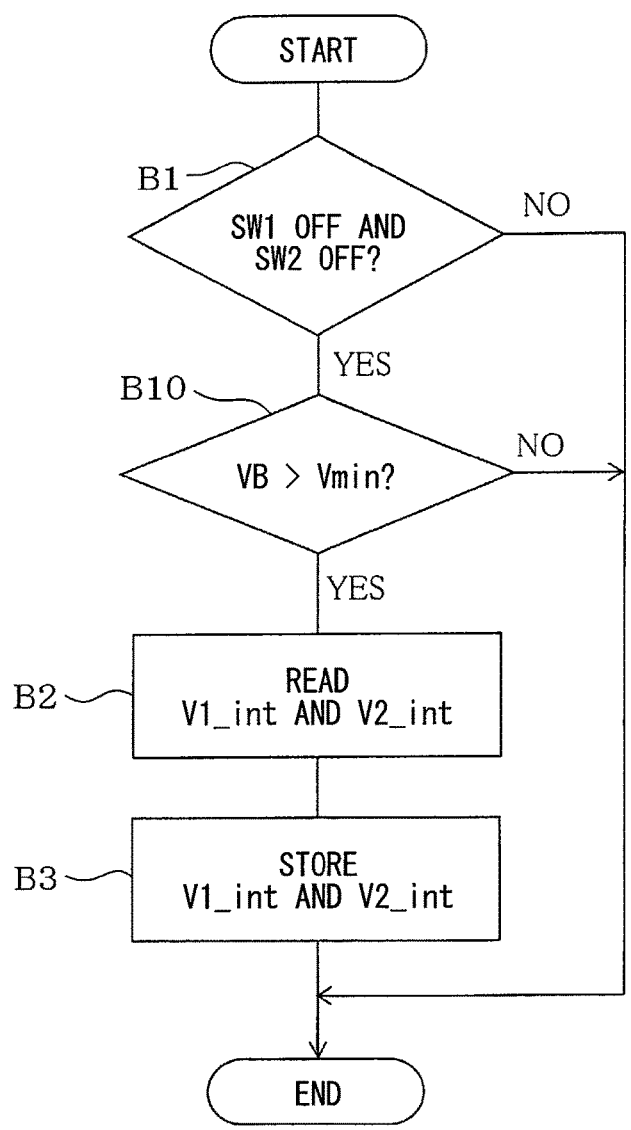
FIG. 10 is a flowchart of a power supply voltage reading process.
Figure 11:
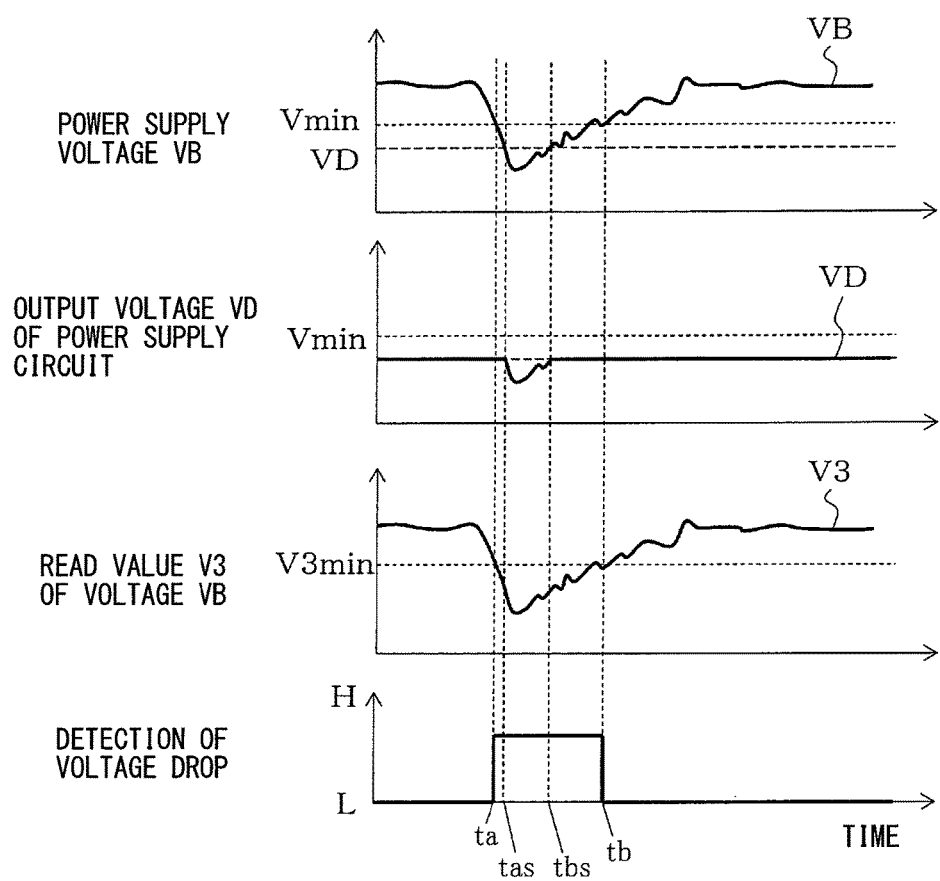
FIG. 11 is a diagram illustrating waveforms of various parts for explaining the effects.

Next, the effects of the configuration described above will be described with reference also to FIG. 9 to FIG. 11. Since the DC power supply 12 that outputs the power supply voltage VB supplies power also to other loads as described above, the voltage may drop largely depending on the case. FIG. 11 illustrates one example of fluctuations in the power supply voltage VB. There may be cases where power supply voltage VB largely drops to the extent that the DC voltage VD generated by the power supply circuit 13, for example, cannot be provided normally. In such cases, as shown in FIG. 11, the power supply circuit 13 may output a voltage lower than the DC voltage VD, which may adversely affect the determination operation of the control circuit 5 supplied with the operating voltage.

In this embodiment, therefore, reading of the initial values and the process of determination are performed on condition that the power supply voltage VB of the DC power supply 12 is high enough to output the output voltage VD of the power supply circuit 13. More specifically, a minimum operating voltage at which the power supply circuit 13 can reliably provide output voltage VD is set as Vmin.

The power supply voltage VB of the DC power supply 12 is monitored by the AD converter 15, and, as shown in FIG. 11, for example, the read value V3 of voltage VB is input to the control circuit 5. The control circuit 5 determines the read value V3 of voltage VB with reference to a threshold voltage V3min, which corresponds to the minimum operating voltage Vmin. When the power supply voltage VB drops to fall below the minimum input voltage Vmin at time ta, the read value V3 of voltage VB drops to fall below the threshold voltage V3min, as shown in FIG. 11. The control circuit 5 detects this drop and outputs an H-level signal to not execute the process of determining a disconnection. After that, at time tas when the power supply voltage VB is equal to or lower than the level of the output voltage VD that needs to be generated by the power supply circuit 13, the output voltage VD also drops following the power supply voltage VB.

When the power supply voltage VB rises again and reaches the level of the output voltage VD at time tbs, the power supply circuit 13 can maintain the normal output voltage VD. When the power supply voltage VB rises further and exceeds the minimum operating voltage Vmin at time tb, the control circuit 5 detects this rise and cancels the low voltage state. This way, the process of determining a disconnection is not performed during the period in which the H-level signal is output, which indicates the low voltage state shown in FIG. 11, so that erroneous detection failure due to power supply fluctuations can be avoided.

Figure 9:
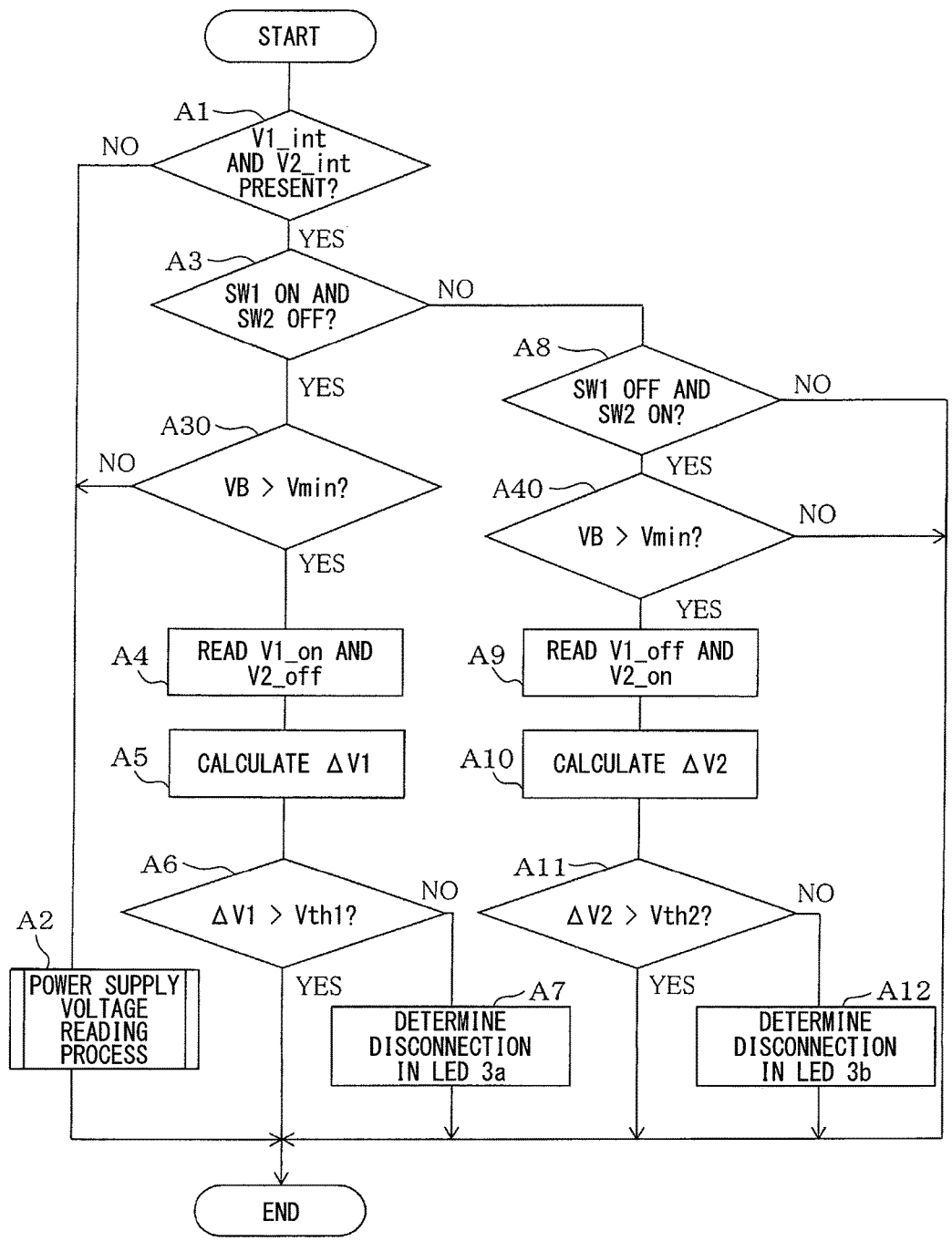
FIG. 9 is a flowchart of a disconnection determination process.

The operation described above is performed when the determination by the control circuit 5 is NO at step A1 in the disconnection determination process shown in FIG. 9 and the power supply voltage reading process is to be executed at the next step A2. As shown in FIG. 10, after the determination at step B1 is made as YES, it is determined whether the power supply voltage VB exceeds the minimum operating voltage Vmin at step 10.

When the determination is YES at this step B10, the process proceeds to steps B2 and B3, where the control circuit 5 reads the initial values and ends the program. When the determination is NO at step B10, the control circuit 5 ends the program without executing the process of reading the initial values. Thus, the determination process is prevented from being executed in a state where the power supply voltage VB is significantly low when the initial values are read.

When the determination at step A3 of the disconnection determination process is YES, or when the determination at step A8 is YES, the control circuit 5 determines whether the power supply voltage VB exceeds the minimum operating voltage Vmin at step A30, or step A40.

When the determination at step A30 or A40 is YES, the control circuit 5 proceeds to step A4 or A9 and carries on the determination process. When the determination at step A30 or A40 is NO, the process of determining a disconnection is not performed and the program ends.

According to the fourth embodiment, in addition to the effects of the first embodiment, reading of initial values and the process of determining a disconnection are canceled in the event that the power supply voltage VB of the DC power supply 12 has reduced significantly so that the output voltage VD of the power supply circuit 13 cannot be secured, and therefore the possibility of erroneous determination can be reduced as much as possible.

Fifth Embodiment

Figure 12:
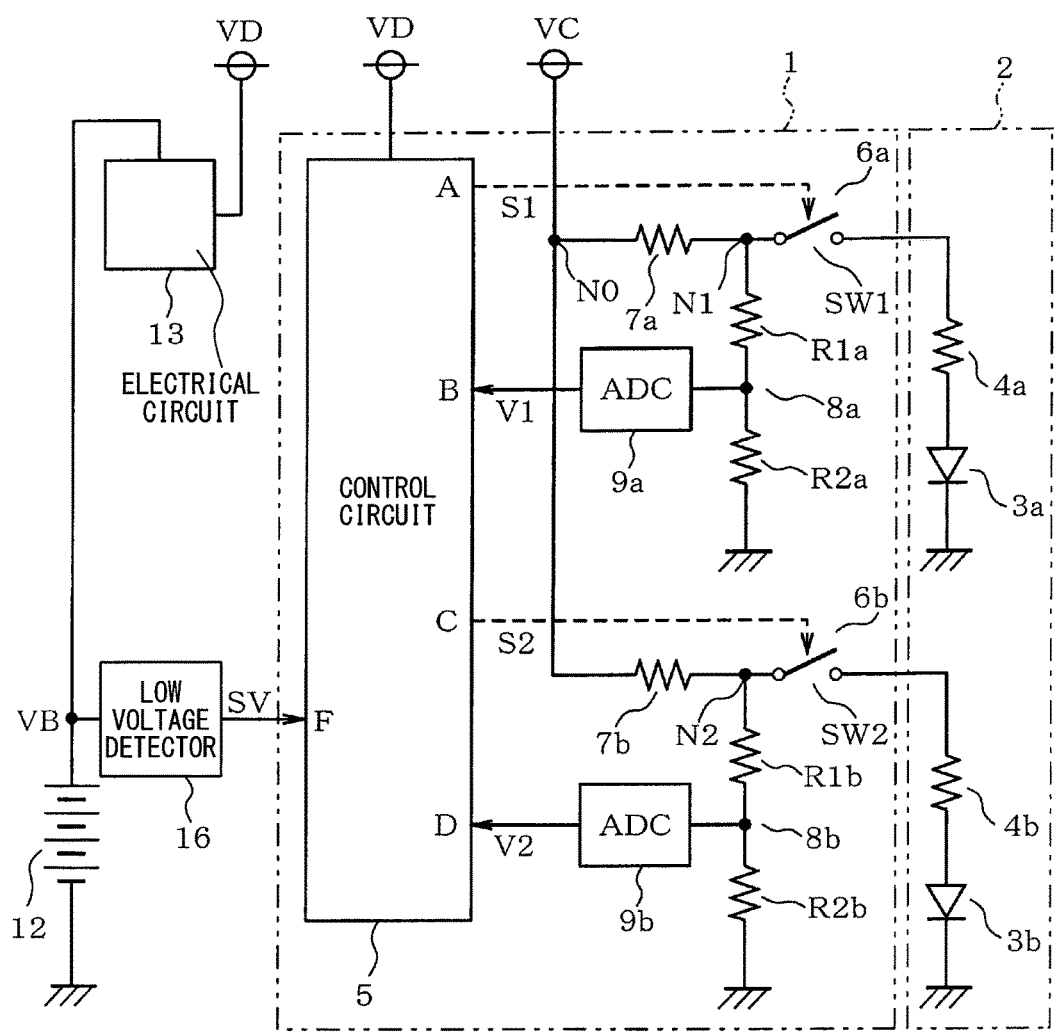
FIG. 12 is an electrical configuration diagram illustrating a fifth embodiment.
Figure 13:
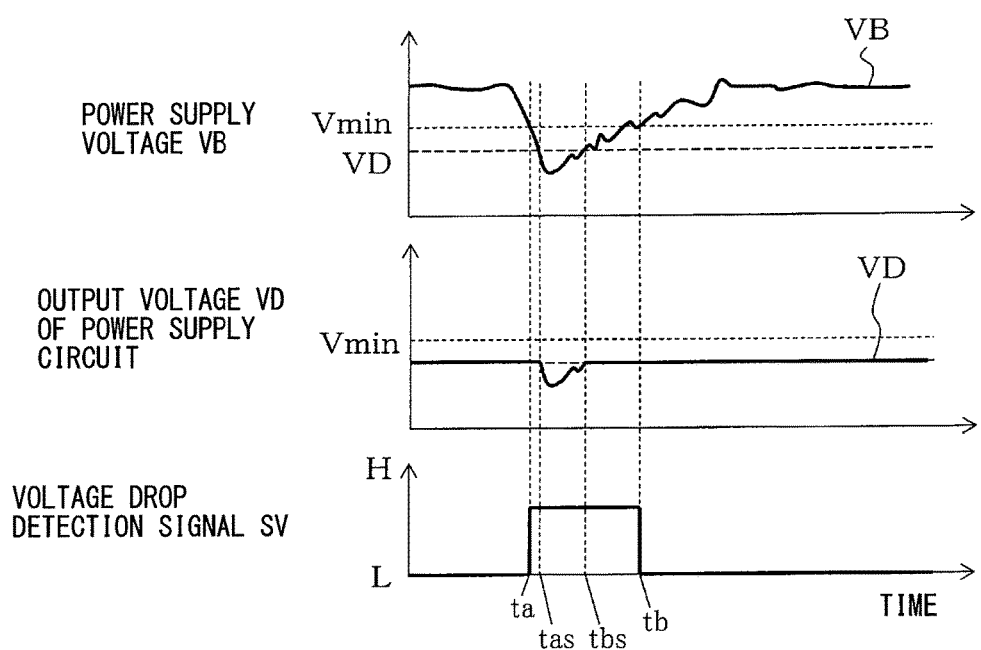
FIG. 13 is a diagram illustrating waveforms of various parts for explaining the effects.

FIG. 12 and FIG. 13 illustrate a fifth embodiment, which will be described below with respect to the parts different from the fourth embodiment. In this embodiment, a low voltage detector 16 is provided instead of the voltage divider circuit 14 and AD converter 15. In the fourth embodiment, the control circuit 5 performs the process of detecting a drop in the power supply voltage VB of the DC power supply 12. In the fifth embodiment, this is performed by the low voltage detector 16.

Similarly to the fourth embodiment, FIG. 13 shows one example of fluctuations of the power supply voltage VB, and FIG. 13 indicates the waveforms when the power supply circuit 13 outputs a voltage lower than the DC voltage VD. The low voltage detector 16 includes a comparator inside, and compares the power supply voltage VB of the DC power supply 12 with the minimum input voltage Vmin, which is the reference voltage to be compared with. When the power supply voltage VB is detected to have dropped to be lower than the minimum input voltage Vmin, the low voltage detector 16 outputs an H-level detection signal VS to the control circuit 5 as shown in FIG. 13. The control circuit 5 determines that the voltage of the DC power supply 12 has dropped based on the input of the H-level detection signal VS from the low voltage detector 16, and prohibits the execution of the process of determining a disconnection described above.

Thus, the same effects as the fourth embodiment can be achieved by the fifth embodiment.

Other Embodiments

The present disclosure is not limited to the embodiments described above and can be applied to various embodiments without departing from the scope of the subject matter, including, for example, the following modifications or extensions.

While energizing circuits 6a and 6b are provided correspondingly to two LEDs 3a and 3b as the loads in the embodiments described above, the invention is not limited to this configuration, and energizing circuits can be provided correspondingly when three or more LEDs are provided.

While LEDs are used as loads in the embodiments described above, the invention is not limited to this configuration, and other constant current-driven elements and circuits can be applied as loads.

While the AD converters 9a and 9b are provided separately in the embodiments described above, these may be integrally provided in an input unit in the control circuit 5.

In the third embodiment, a thermistor 10 is used as the temperature detector. To detect the temperature of the measurement environment, a thermocouple may also be used, for example, or a configuration that detects a forward voltage Vf of a temperature sensing element such as a diode is also possible.

While the configuration of the third embodiment takes into account temperature changes of the measurement environment with a temperature detector, other configurations that detect other factors that cause changes in the measurement environment may also be provided.

It is noted that a flowchart or the processing of the flowchart in the present application includes sections (also referred to as steps), each of which is represented, for instance, as A1. Further, each section can be divided into several sub-sections while several sections can be combined into a single section. Furthermore, each of thus configured sections can be also referred to as a device, module, or means.

What is claimed is:

1. A disconnection detector comprising:
   a plurality of energizing circuits that supply a constant current from a direct current power supply to a plurality of loads through resistor elements, respectively, the resistor elements each having a predetermined resistance value;
   a plurality of voltage detectors that are respectively arranged at the plurality of energizing circuits, and that respectively detect a voltage of a corresponding one of the resistor elements at a load side; and
   a control circuit that determines, for each of the plurality of energizing circuits, a disconnected state of an energizing path to a corresponding one of the plurality of loads, based on voltages respectively detected by the plurality of voltage detectors,
   wherein the control circuit inputs and stores initial values of detected voltages that are detected by the plurality of voltage detectors when the plurality of energizing circuits do not carry out energizing the plurality of loads,
   wherein, when one of the plurality of loads is energized by one of the plurality of energizing circuits, the control circuit calculates a voltage across terminals of one of the resistor elements arranged at the one of the plurality of energizing circuits, which carries out energizing one of the plurality of loads, based on
      a first detected voltage detected by one of the plurality of voltage detectors arranged at the one of the plurality of energizing circuit, which carries out energizing the one of the plurality of loads,
      a second detected voltage detected by another one of the plurality of voltage detectors arranged at another one of the plurality of energizing circuits, which does not carry out energizing another one of the plurality of loads, and
      stored initial values of detected voltages, and
   wherein the control circuits determines that the energizing path to the one of plurality of loads, which is energized, is in a disconnected state when the voltage across terminals of the one of the resistor elements is equal to or lower than a threshold voltage.

2. The disconnection detector according to claim 1,
   wherein, when the voltage across terminals is calculated, the control circuit determines, as an initial value ratio, a ratio between one of the initial values of the detected voltages corresponding to the one of the plurality of energizing circuits obtaining the first detected voltage among the initial values of detected voltages and another one of the initial values of the detected voltages corresponding to the other one of the plurality of energizing circuits obtaining the second detected voltage among the initial values of detected voltages,
   wherein, when the voltage across terminals is calculated, the control circuit calculates a voltage at one terminal on a power supply side of the one of the resistor elements arranged at the one of the plurality of energizing circuits, which carries out energizing the one of the plurality of loads, by multiplying the ratio of the initial values to the second detected voltage, and
   wherein, when the voltage across terminals is calculated, the control circuit calculates the voltage across terminals from a difference between the calculated voltage at the one terminal and the first detected voltage.

3. The disconnection detector according to claim 1,
   wherein, when the voltage across terminals is calculated, the control circuit determine, as an initial value difference, a difference between one of the initial values of the detected voltages corresponding to the one of the plurality of energizing circuits obtaining the first detected voltage among the initial values of detected voltages and another one of the initial values of the detected voltages corresponding to the other one of the plurality of energizing circuits obtaining the second detected voltage among the initial values of detected voltages,
   wherein, when the voltage across terminals is calculated, the control circuit adds the initial value difference to the second detected voltage to calculate a voltage at one terminal, on a power supply side, of the one of the resistor elements arranged at the one of the plurality of energizing circuits, which carries out energizing the one of the plurality of loads, and
   wherein, when the voltage across terminals is calculated, the control circuit calculates the voltage across terminals from a difference between the calculated voltage at the one terminal and the first detected voltage.

4. The disconnection detector according to claim 1,
   wherein the control circuit inputs and stores the initial values of detected voltages immediately before or within a certain period of time before the one of the plurality of loads is energized.

5. The disconnection detector according to claim 1, further comprising:
   a temperature detector that detects ambient temperature of each of the plurality of energizing circuits,
   wherein the control circuit inputs and stores the initial values of detected voltages when the ambient temperature detected by the temperature detector is changed more than a predetermined temperature.

6. The disconnection detector according to claim 1, further comprising:
a power supply circuit that generates an operating power supply for the control circuit by lowering a voltage of a direct current power supply,
wherein the control circuit determines the disconnected state when the voltage of the direct current power supply exceeds a minimum voltage at which the power supply circuit is enabled to generate the operating power supply.

* * * * *